United States Patent
Ouyang et al.

(10) Patent No.: US 6,178,405 B1
(45) Date of Patent: *Jan. 23, 2001

(54) CONCATENATION COMPRESSION METHOD

(75) Inventors: Jing-Zheng Ouyang, San Jose; Nan-Sheng Lin, Fremont, both of CA (US)

(73) Assignee: Innomedia Pte Ltd., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/751,876

(22) Filed: Nov. 18, 1996

(51) Int. Cl.[7] .................................................. G10L 21/04
(52) U.S. Cl. ........................... 704/500; 704/503; 704/504
(58) Field of Search ................................. 704/500, 503, 704/504, 227, 228, 229

(56) References Cited

U.S. PATENT DOCUMENTS

| | | | | |
|---|---|---|---|---|
| 3,862,371 | * | 1/1975 | Neustdat | 704/500 |
| 4,214,125 | * | 7/1980 | Mozer et al. | 704/205 |
| 4,739,401 | * | 4/1988 | Sacks | 358/126 |
| 4,864,620 | * | 9/1989 | Bialick | 381/34 |
| 4,890,282 | * | 12/1989 | Lambert | 370/79 |
| 5,091,782 | * | 2/1992 | Krause | 358/135 |
| 5,142,257 | | 8/1992 | Gamet . | |
| 5,353,374 | * | 10/1994 | Wilson et al. | 704/229 |
| 5,550,847 | * | 8/1996 | Zhu | 371/32 |
| 5,563,649 | * | 10/1996 | Gould et al. | 704/229 |
| 5,608,396 | * | 3/1997 | Cheng | 341/50 |
| 5,611,018 | * | 3/1997 | Tanaka | 704/215 |
| 5,617,142 | * | 4/1997 | Hamilton | 348/405 |
| 5,646,959 | * | 7/1997 | Kamishima | 375/240 |
| 5,664,218 | * | 9/1997 | Kim | 395/821 |
| 5,668,923 | * | 9/1997 | Siwiak | 704/503 |
| 5,675,382 | * | 10/1997 | Bauchspies | 348/390 |
| 5,689,440 | * | 11/1997 | Leitch et al. | 704/500 |
| 5,742,930 | * | 4/1998 | Howitt | 704/500 |
| 5,828,995 | * | 10/1998 | Stayamurti et al. | 704/205 |
| 5,873,065 | * | 2/1999 | Akagiri et al. | 704/500 |

FOREIGN PATENT DOCUMENTS

| | | | |
|---|---|---|---|
| 0 525 544 A2 | 7/1992 | (EP) | G10L/9/18 |
| 0723257 | 7/1996 | (EP) . | |

OTHER PUBLICATIONS

Bailey et al.: "Pipelining Data Compression Algorithms", Computer Journal, vol. 33, No. 4, Aug. 1990, London, GB, pp. 308–313, XP000159501.

Grill B. et al.: "A Two– or Three–Stage Bit Rate Scalable Audio Coding System", American Engineering Society Covention, 1995, pp. 1–8, XP000603102.

* cited by examiner

Primary Examiner—David R. Hudspeth
Assistant Examiner—Daniel Abebe
(74) Attorney, Agent, or Firm—McCutchen, Doyle, Brown & Enersen, LLP

(57) ABSTRACT

A data signal compression technique for real-time voice and data processing where the digitized signal is first compressed to obtain a first compressed signal, and the first compressed signal is then compressed again to obtain a second compressed signal. Within a digital signal processor, digital signals first undergo time scale compression after which the compressed signals undergo audio compression to achieve multiple-compressed signals. Upon reception in a second digital signal processor, the multiple-compressed signals are correspondingly decompressed to achieve a high-quality estimation of the original digital signals.

18 Claims, 3 Drawing Sheets

CONCATENATION COMPRESSION METHOD

TECHNICAL FIELD OF THE INVENTION

The present invention pertains to digital signal compression techniques for voice and data communications and, in particular, to a multiple compression method that saves memory space and facilitates real-time audio communication.

BACKGROUND OF THE INVENTION

Personal computer users have discovered the Internet (a global network of computers) to be an effective vehicle for data and audio communication with remote sites. Because the Internet provides worldwide communication at a cost much lower than standard telephone rates, there is an increasing demand for expanding the capabilities of personal computers to enable real-time voice communication via the Internet. However, there are several limitations to existing technology that inhibit this goal.

Existing telephone lines, which were originally developed for analog voice communication, provide a narrow bandwidth communication link, typically in the range of 200 Hz to 3400 Hz. Because the transmission time for one bit of data is inversely proportional to the frequency, the rate of data transmission is restricted by the bandwidth limitation of telephone lines.

Another obstacle to the transmission of audio data in particular is the large amounts of computer memory and processing time needed to digitize audio data for use in the digital environment of the personal computer. As is known in the art, in order to transmit digitized audio data for real-time use, a data rate in the range of 20–22 kilobytes per second is typically necessary. However, use of a modem is required for modulating and demodulating digital signals for transmission over telephone lines. Most currently available modems can reliably handle only 1.8 kilobytes (14.4 kilobits) to 3.6 kilobytes (28.8 kilobits) per second.

In an effort to increase the rate of data transmission, encoding has been used to allow more than one bit to be represented by a single pulse shape or signal level. This has expanded to the development of integrated services digital network (ISDN) technology, an all-digital communications network. In the ISDN network, all voice, data, and other information, including still and moving images, is digitized and transmitted at high speed over a single, public switched network. The most common transmission method is to translate the binary digits into pulses, which are then transmitted across the network at up to 64 kbits/second. These digital pulses are less susceptible to noise than are corresponding analog signals.

In order to accommodate the narrow bandwidth of existing telephone lines and the low data transmission rate of modems used by the majority of personal computers, digitized data must be compressed prior to transmission and decompressed after reception. The disadvantage of existing compression programs is their high computational overhead, i.e., the substantial processing required to execute several million instructions per second (MIPS) and the large amount of memory needed to store the data.

Audio compression algorithms that may be used in accordance with the teachings of the present invention will be known to those skilled in the art. One technique is the autocorrelation method, of which one variation is described by Jean Larouche in "AutoCorrelation Method for High-Quality Time/Pitch Scaling," published in 1994 by Telecom Paris, Department Signal, Paris, France. Another technique is the absolute value difference algorithm, which adds the absolute values of the difference between successive signal segments and finds the lowest difference. Also well known is the EIA/TIA IS-54 standard, which discloses an algorithm description that one or ordinary skill in the art could implement as a compression algorithm for use with the present invention. A further method is the well-known GSM coding algorithm publicly available through the European Standards Committee. There is also the G723 and G728 algorithms. All of the aforementioned public documents, codes and algorithms are incorporated herein by reference.

While the compression ratios and data rates achieved by means of the compression techniques described above could be used for audio transmission via the Internet, the cost, complexity and low signal quality is unacceptable for real-time audio communication. Hence, there is a need for a data compression method that has low computational overhead, a high compression ratio, and utilizes existing personal computer hardware and compression algorithms to achieve high-quality compression and decompression of real-time audio signals.

SUMMARY OF THE INVENTION

The present invention provides a method for compressing data, and, in particular, digital signals for real-time communication over the Internet in a personal computer environment. In accordance with the method of the present invention, a digital signal is received from a signal source. The digital signal is compressed to a first compressed signal and then compressed again to a second compressed signal. Ideally, the step of compressing the received digital signal includes application of a time scale compression algorithm to the received digital signal, and the step of compressing the first compressed signal comprises application of an audio or speech compression algorithm to the first compressed signal.

In accordance with another aspect of the present invention, a digital signal compression and decompression process is provided for real time implementation on personal computers having a digital signal processor associated therewith. The process comprises the steps of receiving at the digital signal processor a digital signal from a signal source; compressing the digital signal by removing wave form redundancy to obtain a compressed digital signal; compressing the compressed digital signal by application of an audio compression method to the compressed digital signal to obtain a multiple-compressed digital signal for transmission over standard telephone lines; receiving at a digital signal processing means the multiple-compressed digital signal from the telephone lines, decompressing the multiple-compressed digital signal with an audio decompression method to obtain an estimation of the compressed digital signal; and decompressing the compressed digital signal by inserting wave form redundancies in the compressed digital signal to obtain a real-time estimation of the original digital signal generated from the signal source.

In accordance with another aspect of the present invention, the step of compressing the digital signal comprises application of time scale compression to the digital signal. In one embodiment, the time scale compression includes a correlation compression algorithm. In another embodiment, the time scale compression includes an absolute difference algorithm. Other known time scale compression methods may also be used with the present invention.

In accordance with yet a further aspect of the present invention, a method of modifying digitized signals for storage, transmission, and reception by personal computers having a digital signal processor associated therewith is provided. The method comprises modifying original digitized signals received in the digital signal processor from a signal source by concatenating multiple compression methods to achieve low bit rate compressed signals for real-time transmission over standard telephone lines.

In accordance with a further aspect of the present invention, the method further comprises modifying the multiple-compressed digitized signals received in the digital signal processor from a source, such as a digital memory medium or the telephone lines by concatenating multiple decompression methods to achieve an accurate real-time estimation of the original digitized signals.

In accordance with yet another aspect of the present invention, the step of compressing digitized signals by concatenating multiple compression methods comprises a first compression method concatenated with a second compression method, and further where the step of decompressing the compressed digitized signals by concatenating multiple decompression methods comprises a first decompression method concatenated with a second decompression method.

In accordance with another aspect of the present invention, the first compression method comprises time scale compression that removes selected segments of the digitized signals to eliminate signal redundancy, and further wherein the first decompression method comprises time scale decompression that inserts duplicate selected signal segments into the compressed digitized signals.

In accordance with yet another aspect of the present invention, the time scale compression includes a correlation signal compression algorithm. Alternatively, the time scale compression includes an absolute value difference algorithm.

In accordance with another aspect of the present invention, the second compression method comprises audio compression, such as a standard speech compression algorithm.

As will be readily appreciated from the foregoing, the present invention utilizes existing compression algorithms and technology in a unique multiple compression process. By concatenating compression methods, a greater degree of signal compression is obtained while maintaining a high quality in the reproduced speech or audio data. Low computational overhead is achieved by matching compression techniques with existing hardware.

BRIEF DESCRIPTION OF THE DRAWINGS

The foregoing and other features and advantages of the present invention will more readily appreciated as the same become better understood from the detailed description when taken in conjunction with the following drawings, wherein.

DETAILED DESCRIPTION OF THE INVENTION

The present invention is directed to the compression of electronic signals for subsequent processing, storage and/or transmission to a remote site and the corresponding decompression of the received signals. While representative embodiments will be described in the context of real-time speech transmission, it will be understood that the methods described herein can be adapted for use in the processing, storage and/or transmission of audio and non-audio data.

The concatenation method of the present invention may be practiced with existing communication software and hardware, as will be evident to one skilled in the art. The present invention is related to co-pending applications entitled System And Method For Dynamically Reconfigurable Packet Transmission; ISDN—Terminal Adaptor Using Digital Signal Processor. While the present invention is compatible with existing communication software and hardware, better results will be achieved utilizing the inventions disclosed in the related applications referenced above.

Analog audio signals and, in particular, voice and speech signals, must be digitized prior to processing by personal computers. Further processing signal compression is required to enable transmission of the digital signals over the narrow bandwidth of standard telephone lines as previously described. While available compression algorithms achieve sufficiently low data bit rates for their purposes, real-time processing of speech requires greater compression at faster speeds without loss of signal quality.

Figure 1:
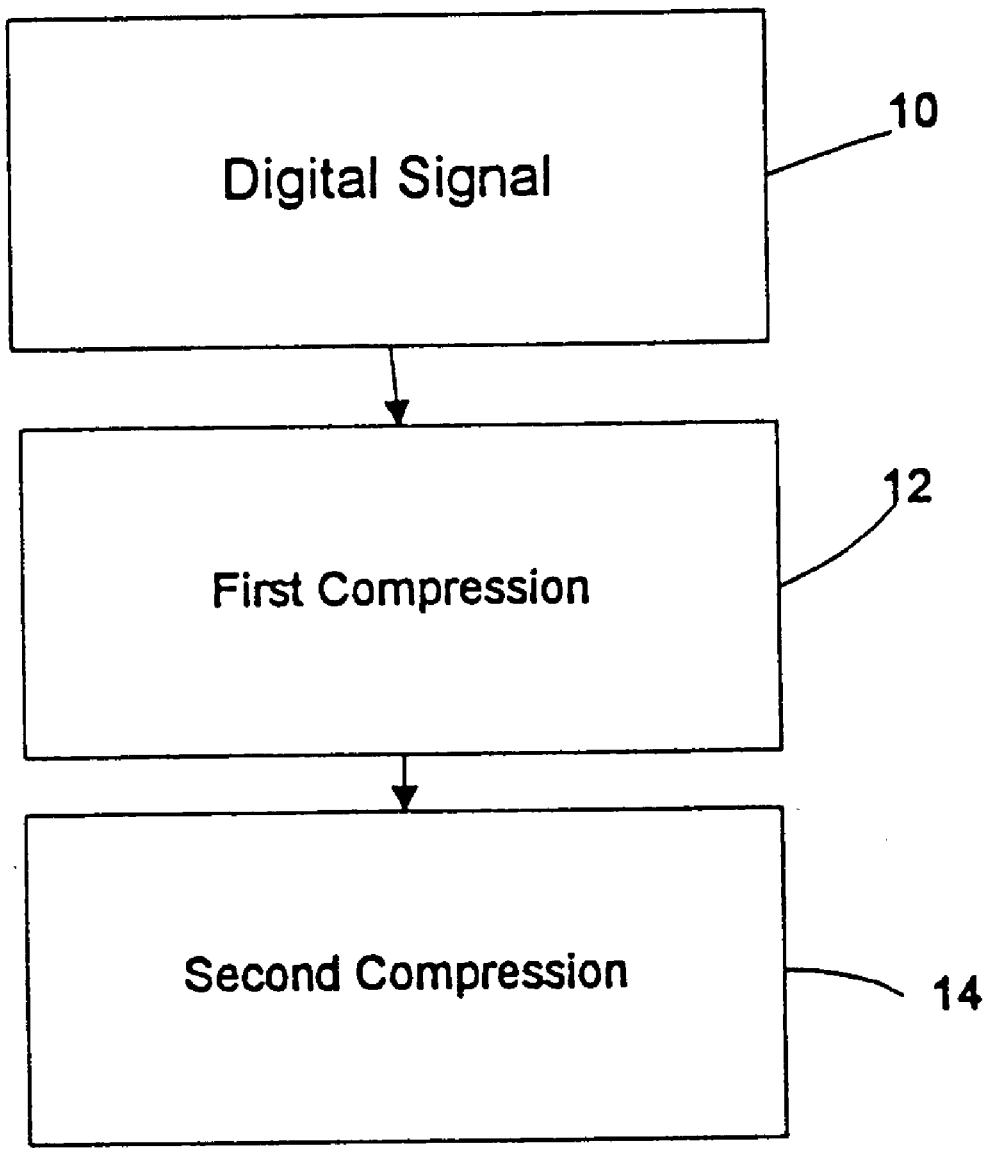
FIG. 1 is a flow chart illustrating the method of the present invention.

In one embodiment of the present invention, a digital audio signal is subjected to multiple compressions prior to processing and subsequent corresponding multiple decompressions. Thus, as shown in FIG. 1, the digital signal 10 is subjected to a first compression 12, resulting in a first compressed signal output. The output of the first compression 12 is then subjected to a second compression 14. This results in a multiple-compressed signal that may be further compressed, as desired, or it may be processed for storage or transmission.

This multiple algorithm speech compression may be applied to real-time voice or speech transmission as described below. The goal of signal compression is the elimination of signal wave form redundancy. After a compression algorithm is applied to a source data, the output may still contain redundancy. In the present invention, if the output of the first compression is suitable for the application of another compression algorithm, further compression can be achieved.

For example, let $S(n)$ and $O(m)$ be the input and output of a first compression algorithm respectively:

$O(m) = T1(S(n))$.
$S = InvT1(O(m))$;
where T1 is the compression algorithm;
InvT1 is the decompression;
$O(m)$ is the output of the compression;
S is the estimation of S.
Applying T2 to $O(m)$, the result is $O1(p)$.
$O1(p) = T2(O(m))$.
$O(m) = InvT2(O1(p))$.
where T2 is second compression algorithm;
InvT2 is the decompression.
$O(m)$ is the estimation of $O(m)$.

With the foregoing concatenation, signal redundancy can be substantially reduced. Concatenation of additional compression algorithms may be done to eliminate additional redundancy. To concatenate two algorithms in the context of encoder and decoder output, the following operations take place:

encoder output O1(p):
   O1(p) =T2(T1(S));
decoder output S1(n):
   S1(n)=InvT1(InvT2(O1(p)).
Where S1 is the estimation of S(n).

Figure 2:
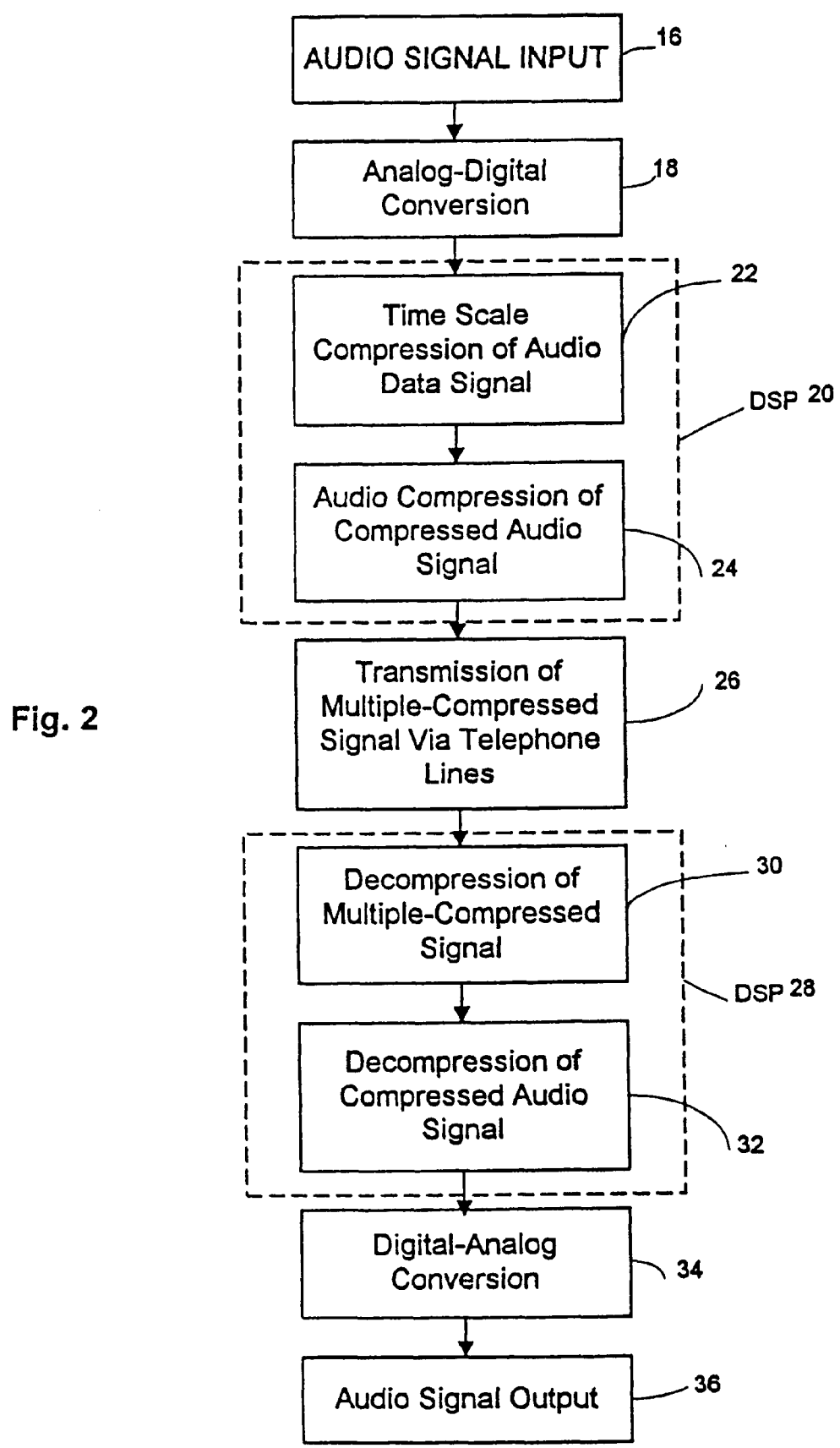
FIG. 2 is a flow chart illustrating the method of the present invention in the context of digital audio signal transmission.

As shown in FIG. 2, an audio signal input 16 is received into an analog-to-digital converter for analog to digital conversion 18. Because personal computers operate in a digital environment, analog speech signals must be converted into digital format for subsequent processing and transmission. The audio signal source may be a microphone, telephone or other similar device that generates analog signals. These analog signals are then converted into digital format by the analog-to-digital converter. Following conversion, the digital audio signal is received at a digital signal processor (DSP) 20 for compression. As was briefly explained above, digitized audio signals consume large amounts of computer memory for storage and computer processing time. The storage and transmission of large amounts of information by personal computers via standard telephone lines, such as are used by the Internet, is not feasible due to signal distortion and loss of data caused by the narrow bandwidth of the communication lines. Consequently, compression of the digital audio signals is required.

As shown in FIG. 2, the digital audio signal is received by the DSP 20 where time scale modification or compression 22 is used to compress the signal. Time scale compression 22 of a signal consists of removing wave form redundancy from the original signal in such a way that the original information is maintained. Various algorithms have be en developed for time scale compression, as will be discussed more fully below. The application of time scale compression to the digital audio signal results in a first compressed audio signal. The compressed audio signal is then passed to the audio compression stage 24 where the first compressed audio signal is further compressed by application of an audio compression algorithm. Several audio or speech compression algorithms as described herein are readily available to those skilled in the art. Application of the speech compression algorithm to the compressed audio signal results in a multiple-compressed signal that is eventually modulated for transmission 26 over telephone lines using standard transmission methods.

The transmission 26 of the multiple-compressed signal is followed by reception of the signal in a second digital signal processor (DSP) 28. Decompression 30 of the multiple-compressed signal is first undertaken to yield an estimation of the compressed audio signal. This is then followed by a decompression 32 of the compressed audio signal to yield an estimation of the digital audio signal. The digital audio signal is then passed to a digital-to-analog converter for digital-to-analog conversion 34. The resulting audio signal output 36 is converted to discernible sound by conventional methods.

In accordance with another embodiment of the present invention, wave form redundancy elimination in the T1 compression described above can be used in combination with any existing speech compression algorithm in T2 to achieve an improved compression rate and improved quality in the speech output. Preferably, the elimination of wave form redundancy is accomplished through time scale modification. Thus, T1 is time compression and InvT1 is time stretching. T1 is the discarding of selected similar portions of the speech wave form and InvT1 is duplicating selected similar portions of the compressed speech wave form. Similarly, T2 is the application of a speech compression algorithm to further compress the time scale modified signal and the InvT2 is decompressing the multiple-compressed speech wave form.

EXAMPLE

In the T1 operation: Search the similar portion of the speech wave form every pitch duration (roughly 10 to 15 ms); and discard the similar portion of speech to get a compression in the range of 1.01:1 to 22:1, and ideally a 2:1 compression.

In the T2 operation: Using any existing speech compression algorithm (for example GSM, G728, G721, and other similar algorithms) to achieve a multiple-compressed signal. In the preferred embodiment, using a GSM as the T2 results in a bit rate of 13.5 kbits/2=6.75 kbits/sec.

In the InvT2 operation: Using a corresponding decompression algorithm to decompress the multiple-compressed signal and obtain an estimation of the first compressed signal.

And finally, in the InvT1 operation: Search the similar portion of the output of the InvT2 operation every pitch duration and duplicate this portion to accomplish time stretching of the compressed signal, thereby obtaining an estimation of the original input signal.

While it may seem counter-intuitive to combine multiple compression algorithms when the goal is a faster compression rate with high quality, the concatenation compression method of the present invention achieves unexpectedly good results. When combined with the compatible hardware and signal processing equipment described herein, a reliable, high quality signal transmission can be obtained in a real-time environment with low computational overhead.

Figure 3:
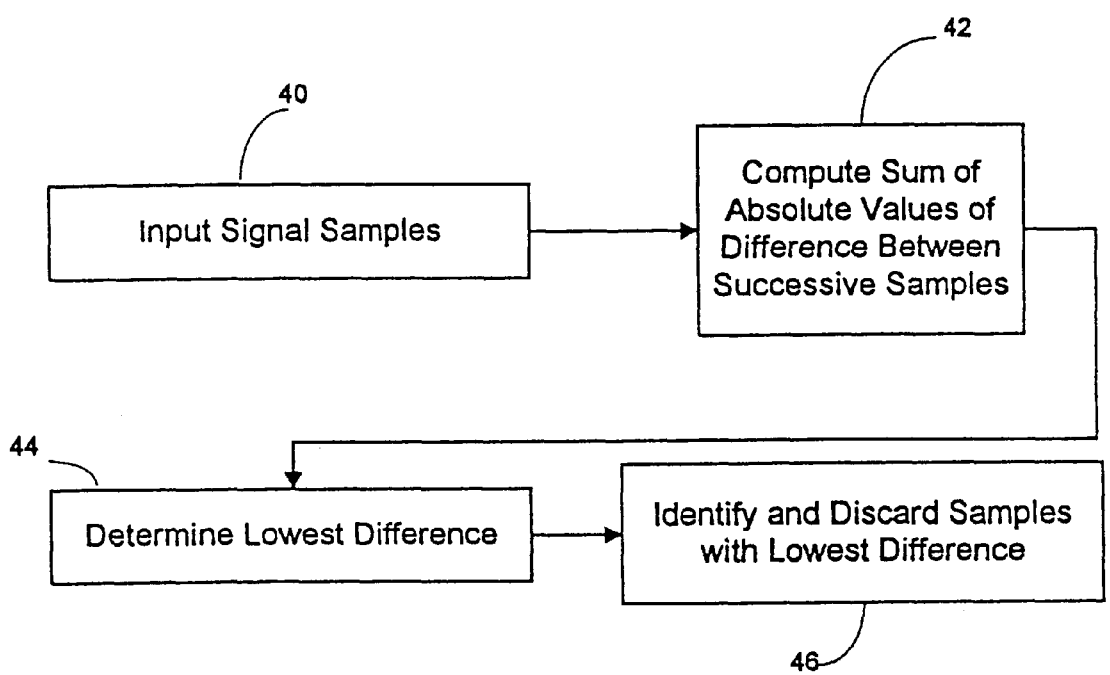
FIG. 3 is a flow chart of one representative time scale compression method for use with the present invention.

Referring next to FIG. 3, illustrated therein is one example of a time scale modification algorithm for compressing speech signals. The absolute difference method illustrated in FIG. 3 uses signal sampling to locate and discard small pieces of the original signal or duplicating the same in the reverse decompression process.

In the absolute difference method, successive signal samples 40 are measured 42 to quantify the absolute value of the difference between successive samples, which are then summed. A determination of the lowest difference 44 is made by comparing the sums of the absolute values. The signal samples with the lowest difference are identified 46 and discarded. This results in a compression of the signal in the time domain without affecting the pitch.

It is to be understood that other time scale modification techniques may be used in the first compression without departing from the spirit and scope of the present invention. However, it has been found that the technique best suited for an application will depend on the hardware used. More particularly, while the absolute difference technique is easy to implement with a high level language such as C++, the C++ code requires too many processing cycles. The traditional correlation method is much simpler when a fixed point digital signal processor is used.

While a preferred embodiment of the invention has been illustrated and described, it is to be understood that various changes may be made therein without departing from the spirit and scope of the invention. For instance, while a preferred time scale modification ratio of 2:1 has been described, it is to be understood that almost any ratio can be used, depending on the level of quality desired. For instance a three to one compression ratio will result in some loss of information. Whether that loss is acceptable will depend on the parameters of the application. In addition, while a high level language such as C++ has been described in conjunction with the present invention because of its prevalent use in Internet telecommunication applications and in the application interface, it will be appreciated by those skilled in the art that any language can be used to implement the present invention. Thus, the scope of the present invention is to be limited only by the claims that follow.

We claim:

1. A method for compression of digital signals for real-time communication over standard telephone lines, the method comprising the steps of:

receiving a digital signal from a signal source;

concatenating a plurality of compression methods to achieve low bit rate compressed signals for the real-time communication, including:

applying to the digital signal a time scale compression for removing wave form redundancy from the digital signal to produce a first compressed digital signal in such a way that the original information is maintained;

applying an additional compression method to eliminate additional wave form redundancy; and applying an audio compression method to the first compressed digital signal to produce a second compressed digital signal.

2. A digital signal compression and decompression process for real-time implementation on personal computers having a digital signal processor associated therewith, the process comprising the steps of:

receiving at the digital signal processor a digital signal from a signal source;

concatenating a plurality of compression methods to achieve low bit rate compressed signals for the real-time implementation, including:

compressing the digital signal by removing wave form redundancy using time scale compression to obtain a compressed digital signal in such a way that the original information is maintained;

applying an additional compression method to eliminate additional wave form redundancy; and compressing the compressed digital signal by application of an audio compression method to the compressed digital signal to obtain a multiple-compressed signal for storage and transmission over standard telephone lines;

receiving at a digital signal processing means the multiple-compressed signal from the telephone lines;

decompressing the multiple-compressed signal with a corresponding decompression method to obtain an estimation of the compressed signal; and decompressing the estimation of the compressed audio signal by inserting wave form redundancies in the compressed audio signal using time scale decompression to obtain a real time estimation of the original digital audio signal generated from the signal source.

3. A digital signal compression and decompression process for real-time implementation on personal computers having a digital signal processor associated therewith, the process comprising the steps of:

receiving at the digital signal processor a digital signal from a signal source;

concatenating a plurality of compression methods to achieve low bit rate compressed signals for the real-time implementation, including:

compressing the digital signal by removing wave form redundancy using time scale compression including a correlation compression algorithm to obtain a compressed digital signal in such a way that the original information is maintained;

applying an additional compression method to eliminate additional wave form redundancy; and compressing the compressed digital signal by application of an audio compression method to the compressed digital signal to obtain a multiple-compressed signal for storage and transmission over standard telephone lines;

receiving at a digital signal processing means the multiple-compressed signal from the telephone lines;

decompressing the multiple-compressed signal with a corresponding decompression method to obtain an estimation of the compressed signal; and decompressing the estimation of the compressed audio signal by inserting wave form redundancies in the compressed audio signal using time scale decompression to obtain a real time estimation of the original digital audio signal generated from the signal source.

4. A digital signal compression and decompression process for real-time implementation on personal computers having a digital signal processor associated therewith, the process comprising the steps of:

receiving at the digital signal processor a digital signal from a signal source;

compressing the digital signal by removing wave form redundancy using time scale compression to obtain a compressed digital signal, the time scale compression including an absolute difference algorithm;

compressing the compressed digital signal by application of an audio compression method to the compressed digital signal to obtain a multiple-compressed signal for storage and transmission over standard telephone lines;

receiving at a digital signal processing means the multiple-compressed signal from the telephone lines;

decompressing the multiple-compressed signal with a corresponding decompression method to obtain an estimation of the compressed signal; and decompressing the estimation of the compressed audio signal by inserting wave form redundancies in the compressed audio signal using time scale decompression to obtain a real time estimation of the original digital audio signal generated from the signal source.

5. A method of modifying digitized signals for communication among personal computers having a digital signal processor associated therewith, the method comprising the steps of:

receiving in the digital signal processor original digitized signals from a signal source; and modifying the original digitized signals by concatenating a first compression method comprising time scale compression that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal.

6. The method of claim 5, comprising the further step of modifying multiple compressed digitized signals received in a digital signal processor by concatenating a first decompression method comprising time scale decompression that inserts duplicate selected signal segments in the compressed digitized signals, and a second decompression method to achieve accurate real-time estimation of the original digitized signals.

7. The method of claim 6, wherein the time scale compression includes an absolute value difference algorithm.

8. A method of modifying digitized signals for communication among personal computers having a digital signal processor associated therewith, the method comprising the steps of:

receiving in the digital signal processor original digitized signals from a signal source; and modifying the original digitized signals by concatenating a first compression method comprising time scale compression including a correlation compression algorithm that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal.

9. A method of modifying digitized signals for communication among personal computers having a digital signal processor associated therewith, the method comprising the steps of:

receiving in the digital signal processor original digitized signals from a signal source; and modifying the original digitized signals by concatenating a first compression method comprising time scale compression that removes selected segments of the digitized signals to eliminate signal wave form redundancy, and a second compression method comprising an audio compression method to achieve a low bit rate compressed signal, the time scale compression including an absolute value difference algorithm.

10. A method of modifying digitized signals for communication among personal computers having a digital signal processor associated therewith, the method comprising the steps of:

receiving in the digital signal processor original digitized signals from a signal source;

modifying the original digitized signals by concatenating a first compression method comprising time scale compression including a correlation compression algorithm that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal; and modifying multiple compressed digitized signals received in a digital signal processor by concatenating a first decompression method comprising time scale decompression that inserts duplicate selected signal segments in the compressed digitized signals, and a second decompression method to achieve accurate real-time estimation of the original digitized signals.

11. A method of modifying digitized signals for communication among personal computers having a digital signal processor associated therewith, the method comprising the steps of:

receiving in the digital signal processor original digitized signals from a signal source; and modifying the original digitized signals by concatenating a first compression method comprising time scale compression that removes selected segments of the digitized signals to eliminate signal wave form redundancy and a second compression method comprising an audio compression method to achieve a low bit rate compressed signal, the time scale compression includes an absolute value difference algorithm; and modifying multiple compressed digitized signals received in a digital signal processor by concatenating a first decompression method comprising time scale decompression that inserts duplicate selected signal segments in the compressed digitized signals, and a second decompression method to achieve accurate real-time estimation of the original digitized signals, the time scale decompression including an absolute value difference algorithm.

12. A method of modifying digitized signals for communication among personal computers having a digital signal processor associated therewith, the method comprising the steps of:

receiving in the digital signal processor original digitized signals from a signal source;

modifying the original digitized signals by concatenating a first compression method comprising time scale compression that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal; and modifying multiple compressed digitized signals received in a digital signal processor by concatenating a first decompression method comprising time scale decompression including a correlation compression algorithm that inserts duplicate selected signal segments in the compressed digitized signals, and a second decompression method to achieve accurate real-time estimation of the original digitized signals.

13. A method of modifying digitized signals for communication among personal computers having a digital signal processor associated therewith, the method comprising the steps of:

receiving in the digital signal processor original digitized signals from a signal source;

modifying the original digitized signals by concatenating a first compression method comprising time scale compression that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal; and modifying multiple compressed digitized signals received in a digital signal processor by concatenating a first decompression method comprising time scale decompression including an absolute value difference algorithm that inserts duplicate selected signal segments in the compressed digitized signals, and a second decompression method to achieve accurate real-time estimation of the original digitized signals.

14. A method of modifying digitized signals for communication over the Internet, the method comprising the steps of:
  receiving original digitized signals in a digital signal processor from a signal source; and
  modifying the original digitized signals by concatenating a first compression method including time scale compression that removes selected segments of the digitized signals to eliminate signal wave form redundancy in such a way that the original information is maintained and an additional compression method to eliminate additional signal wave form redundancy, and a second compression method including an audio compression method to achieve a low bit rate compressed signal.

15. A method for compression of digital signals for real-time communication over standard telephone lines, the method comprising the steps of:
  receiving a digital signal from a signal source; and
  concatenating a plurality of compression methods to achieve low bit rate compressed signals for the real-time communication, including:
    applying to the digital signal a time scale compression including a correlation compression algorithm for removing wave form redundancy from the digital signal to produce a first compressed digital signal in such a way that the original information is maintained;
    applying an additional compression method to eliminate additional wave form redundancy; and
  applying an audio compression method to the first compressed digital signal to produce a second compressed digital signal.

16. A method for compression of digital signals for real-time communication over standard telephone lines, the method comprising the steps of:
  receiving a digital signal from a signal source; and
  concatenating a plurality of compression methods to achieve low bit rate compressed signals for the real-time communication, including:
    applying to the digital signal a time scale compression including an absolute value difference algorithm for removing wave form redundancy from the digital signal to produce a first compressed digital signal in such a way that the original information is maintained;
    applying an additional compression method to eliminate additional wave form redundancy; and
  applying an audio compression method to the first compressed digital signal to produce a second compressed digital signal.

17. A digital signal compression and decompression process for real-time implementation on personal computers having a digital signal processor associated therewith, the process comprising the steps of:
  receiving at the digital signal processor a digital signal from a signal source;
  concatenating a plurality of compression methods to achieve low bit rate compressed signals for the real-time implementation, including:
    compressing the digital signal by removing wave form redundancy using time scale compression including an absolute value difference algorithm to obtain a compressed digital signal in such a way that the original information is maintained;
    applying an additional compression method to eliminate additional wave form redundancy; and
    compressing the compressed digital signal by application of an audio compression method to the compressed digital signal to obtain a multiple-compressed signal for storage and transmission over standard telephone lines;
  receiving at a digital signal processing means the multiple-compressed signal from the telephone lines;
  decompressing the multiple-compressed signal with a corresponding decompression method to obtain an estimation of the compressed signal; and
  decompressing the estimation of the compressed audio signal by inserting wave form redundancies in the compressed audio signal using time scale decompression to obtain a real time estimation of the original digital audio signal generated from the signal source.

18. A method of modifying digitized signals for communication among personal computers having a digital signal processor associated therewith, the method comprising the steps of:
  receiving in the digital signal processor original digitized signals from a signal source; and
  modifying the original digitized signals by concatenating a first compression method comprising time scale compression including an absolute value difference algorithm that removes selected segments of the digitized signals to eliminate signal wave form redundancy in such a way that the original information is maintained and an additional compression method to eliminate additional signal wave form redundancy, and a second compression method comprising an audio compression method to achieve a low bit rate compressed signal.

* * * * *